(12) United States Patent
Grange

(10) Patent No.: US 9,322,098 B2
(45) Date of Patent: Apr. 26, 2016

(54) VALVE-CELL VACUUM DEPOSITION APPARATUS INCLUDING A LEAK DETECTION DEVICE AND METHOD FOR DETECTING A LEAK IN A VACUUM DEPOSITION APPARATUS

(71) Applicant: RIBER, Bezons (FR)

(72) Inventor: Olivier Grange, Saint-Cloud (FR)

(73) Assignee: RIBER, Bezons (FR)

( * ) Notice: Subject to any disclaimer, the term of this patent is extended or adjusted under 35 U.S.C. 154(b) by 487 days.

(21) Appl. No.: 13/847,547

(22) Filed: Mar. 20, 2013

(65) Prior Publication Data
US 2013/0247651 A1    Sep. 26, 2013

(30) Foreign Application Priority Data
Mar. 20, 2012 (FR) ...................................... 12 52499

(51) Int. Cl.
| | |
|---|---|
| G01M 3/04 | (2006.01) |
| C23C 16/52 | (2006.01) |
| C23C 14/24 | (2006.01) |
| C23C 14/56 | (2006.01) |
| F22B 1/06 | (2006.01) |

(Continued)

(52) U.S. Cl.
CPC ............... *C23C 16/52* (2013.01); *C23C 14/243* (2013.01); *C23C 14/564* (2013.01); *F22B 1/066* (2013.01); *G01M 3/20* (2013.01); *G01M 3/202* (2013.01); *G01M 3/226* (2013.01)

(58) Field of Classification Search
CPC ....... G01M 3/20; G01M 3/226; G01M 3/202; C23C 16/52; C23C 14/564; C23C 14/243; F22B 1/066

USPC ............................................................. 73/40
See application file for complete search history.

(56) References Cited

U.S. PATENT DOCUMENTS

| | | | | |
|---|---|---|---|---|
| 2,979,939 A | * | 4/1961 | Shuh .................... | G01M 3/2892 137/460 |
| 4,794,784 A | * | 1/1989 | Bley ...................... | G01M 3/207 73/1.03 |

(Continued)

FOREIGN PATENT DOCUMENTS

| | | |
|---|---|---|
| JP | 7 014766 A | 1/1995 |
| WO | 02/081787 A1 | 10/2002 |

OTHER PUBLICATIONS

French Search Report, dated Nov. 12, 2012, from corresponding French application.

*Primary Examiner* — John Fitzgerald
*Assistant Examiner* — Truong Phan
(74) *Attorney, Agent, or Firm* — Young & Thompson (57) ABSTRACT

The leak detection device is adapted to test the tightness of an inner tank (24) of a valve cell (20) of the vacuum deposition apparatus, either at its filling flange (25) or at its inner tank valve (28). A vacuum deposition apparatus equipped with a helium detector (51) mounted as a by-pass of the output of a high-flow-rate turbomolecular pump (42) which is connected to the vacuum deposition chamber (30) of the vacuum deposition apparatus by a slide gate valve (43). A valve-cell vacuum deposition apparatus equipped with a helium-based leak detection device including gas injection elements (52, 53) adapted to inject a gaseous mixture into the outer enclosure, the gaseous mixture being consisted of pure helium and an inert gas, and a method for detecting a leak in a valve-cell vacuum deposition apparatus are also described.

20 Claims, 3 Drawing Sheets

(51) Int. Cl.
*G01M 3/20* (2006.01)
*G01M 3/22* (2006.01)

(56) References Cited

U.S. PATENT DOCUMENTS 4,998,435 A * 3/1991 Miller et al. .................. 73/40.7
5,777,209 A 7/1998 Tien
7,429,027 B2 * 9/2008 Mayer ..................... F16K 1/385
                                                              137/874
7,677,085 B1 * 3/2010 Lin ..................... F16K 31/0682
                                                              73/40
2004/0105796 A1 6/2004 Grange et al.
2007/0000308 A1 * 1/2007 Weissgerber .......... G01N 30/36
                                                              73/40
2007/0113621 A1 * 5/2007 Kanematsu .................... 73/40.7
2013/0247651 A1 * 9/2013 Grange ..................... 73/40.5 R

* cited by examiner

VALVE-CELL VACUUM DEPOSITION APPARATUS INCLUDING A LEAK DETECTION DEVICE AND METHOD FOR DETECTING A LEAK IN A VACUUM DEPOSITION APPARATUS

FIELD OF THE INVENTION

The invention relates to a vacuum deposition apparatus comprising a valve cell, a transfer tube and a vacuum deposition chamber.

The invention more particularly relates to a vacuum deposition apparatus provided with a helium-based leak detection device.

BACKGROUND OF THE INVENTION

Vacuum deposition apparatuses are widely used in the industry to deposit layers, sometimes very thin, of materials on substrates of various sizes.

It is known in the prior art that a valve-cell vacuum deposition apparatus includes:
  at least one valve cell comprising:
    an outer enclosure,
    an inner tank located inside the outer enclosure and adapted to contain a material to be evaporated,
    an inner tank valve comprising a valve input port in fluidic communication with the inner tank and a valve output port,
  a vacuum deposition chamber,
  a transfer tube comprising a tube input port connected to the valve output port and a tube output port located inside the vacuum deposition chamber, the tube output port including an injector adapted to generate a jet of vapour of the material to be evaporated inside the vacuum deposition chamber, the vacuum deposition chamber being connected to the outer enclosure by means of a connecting flange, and
  pumping means adapted to evacuate the inside of the vacuum deposition chamber, the pumping means comprising a primary pump having a primary pump input and a primary pump output, and a secondary pump having a secondary pump input and a secondary pump output.

The industry of microelectronics uses for example such a vacuum deposition apparatus to deposit materials using techniques such as Molecular Beam Epitaxy (MBE) or Molecular Beam Deposition (MBD). Conductive materials (copper, zinc, nickel, chromium, for example), isolative materials (oxides, nitride, for example), or semi-conductor materials (silicon, germanium, arsenic, phosphorus, antimony, gallium, indium, aluminium, for example) are deposited this way on substrate of silicon, germanium or other suitable materials.

The materials, either elemental or compound, and in particular semi-conductor materials, which are used in a very pure form in such vacuum deposition apparatuses, are stored in high-volume closed inner tanks for ensuring a continuous operation of these apparatuses during long periods and optimizing the costs of production of the semi-conductor components manufactured. The price of these materials being high, it is necessary to avoid the unnecessary loss or the irreversible degradation of all or part of the volumes stored in the inner tanks.

Therefore, the inner tanks of materials must be sealingly closed so as, for example, to prevent any leak of vapour of the material to be evaporated toward the outside of the inner tank or to prevent any oxidation or other chemical reaction with another compound (water, for example) entering into the inner tank. This makes it possible not to lose the content of the inner tank, which would cause additional costs of exploitation.

Likewise, the inner tank valve must be tight, that is to say that in its "closed" position, it totally blocks the flowing of the material to be evaporated between the inner tank and the vacuum deposition chamber. This makes it possible in particular not to pollute the vacuum deposition chamber with the material to be deposited when it is not desired, which would cause problems, for example when depositing another material on the substrate.

The vacuum deposition apparatuses according to the prior art do not make it possible to verify rapidly and in any circumstances the tightness of the inner tank or the inner tank valve, in particular in operation or during the use of pyrophoric compounds.

Leak detection systems are known from the prior art, which make it possible to test the tightness of the other members of the apparatus, such as the outer enclosure or the vacuum deposition chamber, for example.

SUMMARY OF THE INVENTION

In order to remedy the above-mentioned drawback of the prior art, the present invention proposes a valve-cell vacuum deposition apparatus equipped with a leak detection device for testing the tightness of the inner tank and/or the inner tank valve, with a short response time and a high measurement dynamics.

For that purpose, the invention relates to a valve-cell vacuum deposition apparatus as described in the introduction, the vacuum deposition apparatus being characterized in that it includes a leak detection device comprising:
  gas injection means adapted to introduce helium in the vacuum deposition chamber,
  gas pumping means adapted to pump the helium present in the vacuum deposition chamber,
  a helium detector comprising a detector input, the helium detector delivering a signal representative of the helium flow rate through it,
  pressure measuring means adapted to measure the pressure inside the vacuum deposition chamber, and
  signal processing means adapted to process the signal relating to the helium flow rate delivered by the helium detector and the signal delivered by the pressure measuring means, to deliver a signal representative of the leak rate of the inner tank and/or the inner tank valve, and in that the pumping means also include:
  a secondary pump valve placed between the vacuum deposition chamber and the secondary pump input, for example via a high-conductance path,
  a primary pump valve placed between the secondary pump output and the primary pump input,
  a by-pass valve placed between the secondary pump output and the input of the helium detector, the by-pass being made upstream the primary pump valve.

The vacuum deposition apparatus according to the invention is so arranged that it is possible:
  to close the primary pump valve when the by-pass valve is open, the compressed gases coming out of the secondary pump output being then conducted toward the detector input, and
  to close the by-pass valve when the primary pump valve is open, the compressed gases coming out of the secondary pump output being then conducted toward the primary pump input.

Therefore, the device according to the invention makes it possible to use the combined pumping capacities of the secondary pump and the primary pump to evacuate very rapidly the vacuum deposition chamber, as soon as the secondary pump valve opens, and to discharge this way the major part of the gaseous helium present in the vacuum deposition chamber. Then, this high quantity of helium does not saturate the helium detector of the leak detection device, which usually includes a mass spectrometer.

Moreover, upon opening of the by-pass valve and closing of the primary pump valve, as the helium detector is not saturated with helium, it can perform very rapidly a leak detection test, using all the measurement dynamics of the detector.

That way, a leak of the inner tank valve is detected with a low response time and a good accuracy.

The use of the secondary pump valve makes it possible, when this valve is closed, to separate the vacuum deposition apparatus from the pumping means of the vacuum deposition chamber, these latter being nevertheless capable of operating in continuous so that their pumping capacities are immediately available when the secondary pump valve opens.

Moreover, other advantageous and non-limitative characteristics of the vacuum deposition apparatus according to the invention are the following:
- the signal processing means deliver a signal representative of the leak rate of the inner tank valve and the inner tank;
- the inner tank valve is located inside the outer enclosure, with its valve input port connected to the inner tank;
- the tube input port of the transfer tube is located inside the outer enclosure, with the transfer tube going through a first wall of the outer enclosure and a second wall of the vacuum deposition chamber;
- the pressure measuring means deliver a signal representative of the pressure inside the inner tank;
- the outer enclosure is in fluidic communication with the vacuum deposition chamber;
- there are provided isolation means adapted to isolate the outer enclosure from the vacuum deposition chamber;
- the isolation means comprise the inner tank valve;
- the isolation means comprise a weld between the outer enclosure and the transfer tube;
- the secondary pump is a turbomolecular pump;
- the secondary pump valve is a slide gate valve;
- the secondary pump valve is a butterfly valve or a pendulous valve;
- the gas injection means of the leak detection device are also adapted to introduce an inert gas in the vacuum deposition chamber, the inert gas forming a gaseous mixture with helium;
- the leak detection device also comprises piloting means adapted to control the gas injection means and the opening and closing of the inner tank valve, the secondary pump valve, the primary pump valve and the by-pass valve.

The present invention has several advantages. It allows a very rapid stabilization of the signal delivered by the helium detector, allowing the measurement to be performed before the pressure in the inner tank decreases significantly. It also pushes back the pressure domain in which the pressure decrease in the inner tank can be pertinently linked to a leak of this inner tank.

The vacuum deposition apparatus according to the invention makes it possible to measure precisely the valve conductances of the inner tank valve and of a filling flange of all the valve cells installed on the vacuum deposition apparatus, and this over several decades and within a few minutes.

The leak detection device may be used on valve cells without delay, in particular in nominal operating temperature and pressure conditions, and without re-aeration of the vacuum deposition chambers.

Most of the existing leak detectors may be used with the vacuum deposition apparatuses according to the invention.

The secondary pump may be installed anywhere on the high-conductance pumping line and not necessarily with a secondary pump installed on the vacuum deposition chamber.

The additional cost for implementing a vacuum deposition apparatus according to the invention is much reduced when the use of a secondary pump and an existing leak detector is possible.

With such a vacuum deposition apparatus, the response time of the tests of external leak of the high-volume vacuum deposition chambers is significantly reduced and the efficiency of the leak research is widely improved.

The invention also relates to a method for detecting a leak in a valve-cell vacuum deposition apparatus, the vacuum deposition apparatus including:
- at least one valve cell comprising:
  - an outer enclosure,
  - an inner tank, located inside the outer enclosure, wherein the inner tank contains a material to be evaporated,
  - an inner tank valve comprising a valve input port in fluidic communication with the inner tank and a valve output port,
- a vacuum deposition chamber, and
- a leak detection device, the leak detection method being characterized in that it includes:
- firstly, an initialization step wherein:
  - the inside of the vacuum deposition chamber is evacuated, and
  - an initial leak flow rate in the vacuum deposition chamber is measured by means of a leak detection device, and
- secondly, a measurement step wherein:
  - the inner tank valve is open to place the vacuum deposition chamber in fluidic communication with the inner tank, and
  - a gaseous mixture is injected in the vacuum deposition chamber, and
  - a pressure P0 inside the inner tank is measured, and
  - the inner tank valve is closed, and
  - the inside of the vacuum deposition chamber is evacuated down to a predetermined pressure in the vacuum deposition chamber, and
  - the vacuum deposition chamber is placed in communication with the leak detection device, and
  - a final leak flow rate in the vacuum deposition chamber is measured by means of the helium detection device, and
  - a leak rate of the inner tank and/or inner tank valve is deduced therefrom.

Moreover, other advantageous and non-limitative characteristics of the leak detection method according to the invention are the following:
- at the end of the measurement step, the leak rate of the inner tank valve and the inner tank is deduced;
- the inner tank valve of the vacuum deposition apparatus is located inside the outer enclosure, with its valve input port connected to the inner tank.

BRIEF DESCRIPTION OF THE DRAWINGS

Embodiments of the invention will be described in detail with reference to the drawings, in which.

DESCRIPTION OF THE PREFERRED EMBODIMENTS

To begin, it is to be stated that, in the following description, the terms "top" and "bottom" are used in relation to the room in which the vacuum deposition apparatus is installed, the top denoting the side directed toward the ceiling of the room and the bottom denoting the side directed toward the floor. Likewise, the terms "lower" and "upper" will denote the sides directed toward the floor and the ceiling, respectively.

First Embodiment

Figure 1:
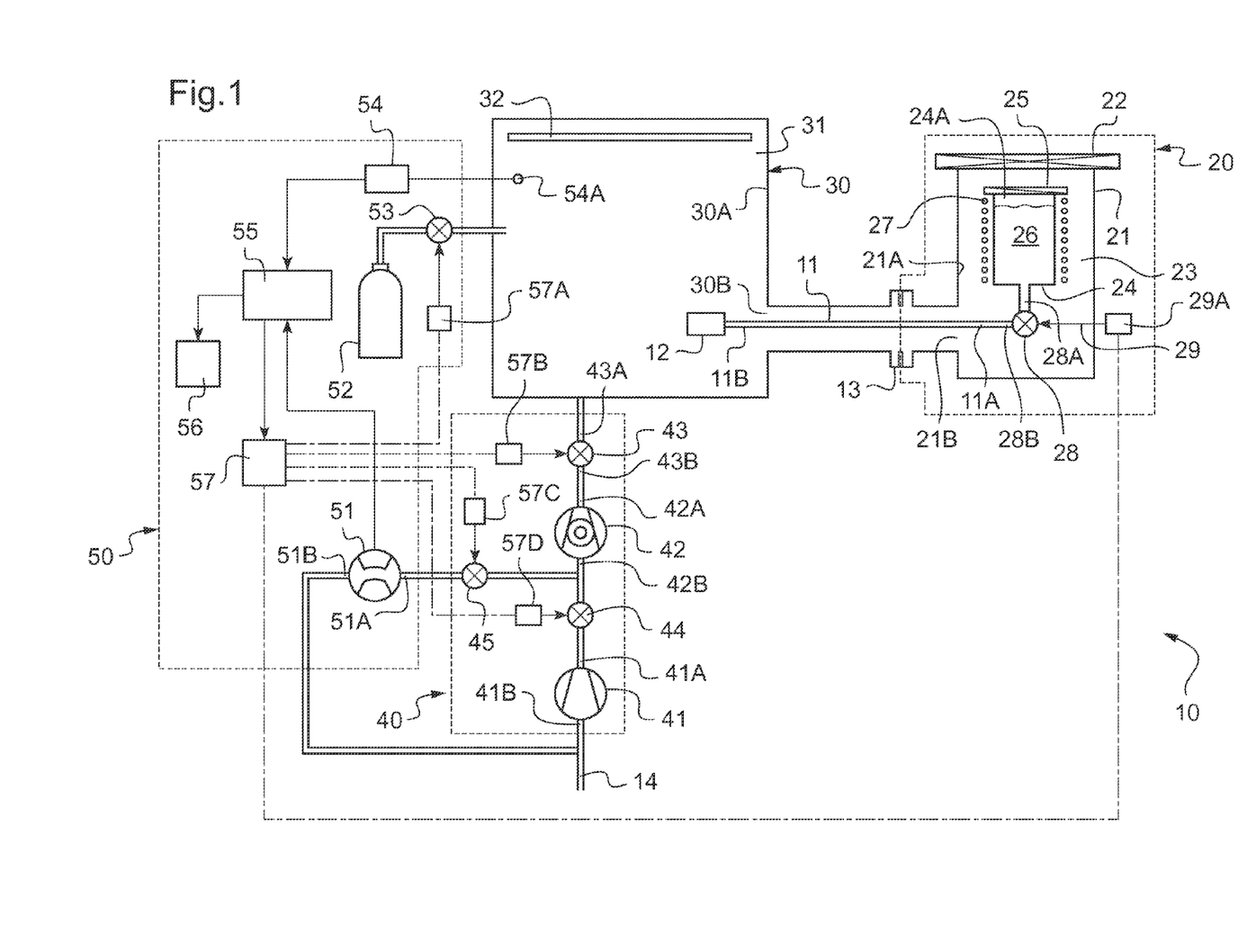
FIG. 1 is a schematic overall view of a vacuum deposition apparatus according to a first embodiment of the invention.

FIG. 1

FIG. 1 shows a vacuum deposition apparatus 10 of the type of those used to implement MBE layer deposition techniques.

This vacuum deposition apparatus 10 includes first of all a source or valve cell 20. It will be considered herein that the vacuum deposition apparatus 10 includes only one valve cell 20. Nevertheless, the invention applies as well to a vacuum deposition apparatus including several valve cells, and the one skilled in the art will be able make the required adaptations to the invention so that it can be applied to such a type of apparatus.

The valve cell 20 comprises an outer enclosure 21 generally tightly closed on its upper part by a cell flange 22. This cell flange 22 is a so-called "cold" flange insofar as its temperature is close to the ambient temperature outside the outer enclosure 21 and the vacuum deposition apparatus 10. In the standard operating conditions, the cell flange 22 has a temperature comprised between 20° C. and 250° C.

The outer enclosure 21 includes outer enclosure walls 21A that define with the cell flange 22 an outer enclosure volume 23. When the cell flange 22 tightly closes the outer enclosure 21, the pressure inside the outer enclosure 21 is comprised between $10^{-2}$ and $10^{-3}$ millibar (mbar).

Upon re-aeration, i.e. when the cell flange 22 is open, the pressure inside the outer enclosure 21 is equal to the pressure inside the room, substantially equal to 1013 mbar (i.e. about 1 atmosphere).

Therefore, as the vacuum deposition apparatus 10 is in ambient conditions where the pressure outside the outer enclosure 21 is substantially equal to 1013 mbar, the cell flange 22 must ensure an extremely high tightness between the outer enclosure volume 23 and the outside of the outer enclosure 21, the pressure difference between this two environments being very high.

The valve cell 20 also includes an inner tank 24 entirely located inside the outer enclosure 21, in the outer enclosure volume 23. The inner tank 24 is generally arranged vertically and tightly closed by a filling flange 25 located on its upper side. The inner tank 24 contains a material to be evaporated 26, partly filling the inner tank 24, leaving a free volume 24A in the top part of the inner tank 24.

In the embodiment shown in FIG. 1, the material to be evaporated 26 is arsenic (chemical symbol As), which is used here in the form of arsenic solids.

In normal conditions, the pressure in the inner tank 24 is comprised between 0.1 mbar and 10 mbar, the pressure depending on the temperature inside the inner tank 24.

As a variant, the material to be evaporated may be for example in the form of solid ingots.

As another variant, the material to be evaporated may be for example phosphorus, antimony, selenium, sulfur, tellurium, magnesium, or compounds such as cadmium tellurium (CdTe), zinc selenide (ZnSe) or gallium phosphorus (GaP). According to the materials, these latter may be stored inside the inner tank in solid or liquid form.

The filling flange 25 makes it possible to refill the inner tank 24 when the quantity of material to be evaporated 26 comes to run out in the inner tank 24. To carry out this refilling operation, an operator opens the outer enclosure 21 by removing the cell flange 22 and opens the inner tank 24 by removing the filling flange 25. The operator may then fill the inner tank 24 with a new quantity of material to be evaporated 26. The operator then closes the inner tank 24 by means of the filling flange 25 and closes finally the outer enclosure 21 by means of the cell flange 22.

At the end of a step of filling (or refilling) the inner tank 24, it is necessary to make sure that the filling flange 25 tightly closes the inner tank 24 and that no leak is liable to occurs from the inner tank 24 toward the outer enclosure volume 23. It will be seen how the embodiment of the vacuum deposition apparatus 10 according to the invention described hereinafter makes it possible to detect such a leak on the inner tank 24.

The material to be evaporated 26 contained in the inner tank 24 is heated by heating means 27 arranged at the periphery of the inner tank 24. The heating means 27 here comprise heating resistances radiating to the inner tank 24 and therefore increasing the temperature thereof. In operating condition, the inner tank 24 is at a temperature comprised between 50° C. and 600° C.

The pressure inside the outer enclosure 21 being low during the operation of the vacuum deposition apparatus 10, in particular when the heating means 27 radiate heat, the outer enclosure walls 21A remain cold, as the relative vacuum inside the outer enclosure volume 23 limits the heating thereof by gaseous conduction from the heating means 27.

Once the material to be evaporated 26 is in gaseous form thanks to its temperature increase due to heating by the heating resistances 27, the vapours of the material to be evaporated 26 are conducted from the output of the inner tank 24 to an inner tank valve 28.

As shown in FIG. 1, this inner tank valve 28 is located inside the outer enclosure 21 and comprises a valve input port 28A and a valve output port 28B. The valve input port 28A of the inner tank valve 28 is connected to the output of the inner tank 24.

In other words, the valve input port 28A is in fluidic communication with the inner tank 24.

Generally, a flap 29 linked to a piston allows opening or closing the inner tank vale 28, the flap 29 being controlled by means of an actuator 29A located outside the outer enclosure 21. Therefore, the inner tank valve 28 is controllable from the outside.

When the inner tank valve 28 is in open position, it lets the material to be evaporated 26 pass through, the latter being capable of flowing from the valve input port 28A to the valve output port 28B.

When the inner tank valve 28 is in closed position, it normally inhibits any flowing of the material to be evaporated 26 from the valve input port 28A toward the valve output port 28B. In this closed position, the inner tank valve 28 is relatively tight. Nevertheless, it is necessary to verify the tightness of this inner tank valve 28 so as to ensure that no leak is liable to occur, i.e. the leak level is below the tolerable leak threshold.

Such a leak may occur between the valve input port 28A and the valve output port 28B. It is then referred to "in line" leak, such leak characterizing the more or less closed position of the inner tank valve 28.

Another leak may also occur from the inner tank valve 28 toward the outer enclosure volume 23, and thus between the inner tank 24 and the outer enclosure 21.

It will be seen how the embodiment of the vacuum deposition apparatus 10 according to the invention described hereinafter makes it possible to detect such leaks on the inner tank valve 28.

The actuator 29A allows the precise control of the flap 29 so that the inner tank valve 28 can take several positions, between the two extreme positions, open and closed.

As shown in FIG. 1, the vacuum deposition apparatus 10 also includes a transfer tube 11, the transfer tube 11 including a tube input port 11A and a tube output port 11B.

The tube input port 11A of the transfer tube 11 is located inside the outer enclosure 21 and is connected to the valve output port 28B of the inner tank valve 28.

As shown in FIG. 1, the transfer tube 11 goes through a first wall 21A of the outer enclosure 21, at a first opening 21B, and through a second wall 30A of a vacuum deposition chamber 30, at a second opening 30B, in such a way that the tube output port 11B of the transfer tube 11 is located inside the vacuum deposition chamber 30, in a chamber volume 31.

The vacuum deposition chamber 30 is connected to the outer enclosure 21 by means of a connecting flange 13. In the particular embodiment of the invention shown in FIG. 1, the connecting flange 13 is such that the outer enclosure 21 communicates with the vacuum deposition chamber 30, the outer enclosure volume 23 and the chamber volume 31 forming a vacuum deposition apparatus volume.

The outer enclosure 21 is thus here in fluidic communication with the vacuum deposition chamber 30.

Therefore, in this configuration, at the static equilibrium, the pressure in the outer enclosure volume 23 and the pressure in the chamber volume 31 are identical. Hereinafter, it will thus be referred only to the chamber pressure.

Thus arranged, the transfer tube 11 allows conducting the vapours of the material to be evaporated 26 from the valve cell 20, and more particularly from the tube input port 11A of the transfer tube 11 connected to the inner tank valve 28 that is not closed, to the vacuum deposition chamber 30, thanks to its tube output port 11B.

The vacuum deposition chamber 30 includes in its upper part a substrate 32 on which layers of different materials are deposited, and in particular layers of the material to be evaporated 26, which is here arsenic.

For that purpose, the tube output port 11B of the transfer tube 11 includes an injector 12 whose shape and size are optimized to generate a jet of vapour of the material to be evaporated 26 inside the deposition chamber 30, the shape, the direction and the intensity of the jet being adjusted so that the desired layer of material to be evaporated 26 is deposited on the substrate 32.

In a variant of the first embodiment, the vacuum deposition apparatus comprises a valve cell comprising an outer enclosure, an inner tank containing a material to be evaporated, and an inner tank valve of the "drain plug" type. Such a source is, for example, the source of the R IBER Company of the "VCOR" range, marketed under the references "VCOR 110" or "VCOR 300".

Such a valve cell is made of a material of the PBN (pyrolytic boron nitride) type so that it can be used for the evaporation of corrosive materials such as antimony (Sb), magnesium (Mg), tellurium (Te) or selenium (Se). The inner tank valve is, according to this variant, formed by a control drain plug allowing, in one direction, the flowing of the material to be evaporated, and in the other direction, the filling of the inner tank.

According to a particular embodiment of the invention shown in FIG. 1, the vacuum deposition apparatus 10 also includes pumping means 40 for evacuating the inside of the vacuum deposition chamber 30 to reach a chamber pressure comprised between $10^{-3}$ and $10^{-12}$ mbar, typically between $10^{-8}$ and $10^{-12}$ mbar.

The pumping means 40 includes first of all a primary pump 41 and a secondary pump 42, mounted in series.

The primary pump 41 has a primary pump input 41A and a primary pump output 41B. The primary pump 41 is here a conventional pump of the diaphragm pump type. Such a primary pump 41 makes it possible to reach vacuum levels with pressures down to $10^{-3}$ mbar.

As a variant, the primary pump may be for example a scroll pump, a vane pump or a roots pump.

The primary pump output 41B is connected to an exhaust pipe 14 for discharging all the gases pumped from the vacuum deposition apparatus 10 by the pumping means 40.

The secondary pump 42 has a secondary pump input 42A and a secondary pump output 42B having a substantially identical flow rate. The pressure ratio between the secondary pump output 42B and the secondary pump input 42A is here higher than 10000 in conditions of normal operation.

According to a particular embodiment of the invention shown in FIG. 1, the secondary pump 42 is a turbomolecular pump. This turbomolecular pump 42, which is here a multistages turbomolecular pump, allows reaching vacuum levels with pressures in the vacuum deposition chamber 30 comprised between $10^{-3}$ mbar and $10^{-11}$ mbar.

The secondary pump 42 is here a "high flow rate" pump, with a pumping speed of the order of 2000 liters per second. The volume of the vacuum deposition apparatus 10 being slightly higher than 2000 liters, the major part of the gases present in the vacuum deposition chamber 30, for example 99.99% of the gases, is pumped very rapidly, within about 10 seconds.

In the configuration of FIG. 1, the pumping means 40 are mounted on the vacuum deposition apparatus 10 at the level of the vacuum deposition chamber 30.

As a variant, the pumping means may be mounted on another chamber, for example a loading or unloading chamber, a degassing chamber or a distribution chamber, this other chamber being in fluidic communication with the vacuum deposition chamber of the vacuum deposition apparatus by means of a high-conductance gaseous line.

More precisely, in the embodiment of the invention illustrated in FIG. 1, the pumping means 40 includes a secondary pump valve 43 placed between the vacuum deposition chamber 30 and the secondary pump 42. This secondary pump valve 43 includes a secondary pump valve input 43A and a secondary pump valve output 43B. The secondary pump valve input 43A is in fluidic communication with the vacuum deposition chamber 30 and the secondary pump valve output 43B is connected to the secondary pump input 42A.

Preferentially, the secondary pump valve 43 is here a valve of the "slide gate valve" type.

As a variant, the secondary pump valve may for example be a butterfly valve or a pendulous valve.

When the secondary pump valve 43 is open and when the secondary pump 42 operates, then a vacuum is formed inside the vacuum deposition chamber 30.

When the secondary pump valve 43 is closed, it isolates the vacuum deposition chamber 30 from the remaining of the pumping means 40, and in particular from the secondary pump 42. However, the latter may continue to operate despite the closing of the secondary pump valve 43.

Indeed, the secondary pump 42 reaches its optimal operating condition after only a certain time, typically after 15 to 30 minutes. Therefore, the secondary pump 42 is not always stopped when the vacuum deposition apparatus 10 operates and when the chamber pressure has reached the set point fixed by the operator.

The pumping means 40 also include a primary pumping valve 44 placed between the secondary pump output 42B and the primary pump input 41A. This primary pump valve 44, when open, allows placing in communication the secondary pump 42 on the one hand, and the primary pump 41 on the other hand.

The pumping means 40 finally include a by-pass valve 45 placed at the output of the secondary pump 42. More particularly, the by-pass valve 45 is mounted as a "by-pass" of the output of the secondary pump 42B, the by-pass being made upstream the primary pump valve 44. This allows in particular, when the by-pass valve 45 is open and when the primary pump valve 44 is closed, conducting the compressed gases coming out of the secondary pump output 42B toward the output of the by-pass valve 45. This also allows, when the by-pass valve 45 is closed and when the primary pump valve 44 is open, conducting the compressed gases coming out of the secondary pump output 42B toward the input of the primary pump 41A.

As shown in FIG. 1, the vacuum deposition apparatus 10 also comprises a leak detection device 50.

The following description of the leak detection device 50 and the operation thereof will reveal the advantage of using pumping means 40 as arranged and described hereinabove to detect potential leaks of the inner tank 24, either at the filling flange 25 or at its inner tank valve 28.

The leak detection device 50 comprises a helium detector 51 comprising a detector input 51A and a detector output 51B.

The leak detection device 50 also comprises gas pumping means (not shown) for sucking up the gases arriving at the detector input 51A so as to eject them to the detector output 51B. These gas pumping means are generally weak. They have here a pumping capacity of about 4 liters per second for helium (130 liters per second for nitrogen).

As shown in FIG. 1, the detector input 51A is connected to the output of the by-pass valve 45 and the detector output 51B is connected to the exhaust pipe 14.

The helium detector 51 generally comprises a mass spectrometer (not shown) for measuring the quantity of helium present in the gaseous flow flowing between the detector input 51A and the detector output 51B. The helium detector 51 thus delivers a signal representative of the helium flow rate (in liters per second or $l \cdot s^{-1}$) passing through it.

The helium detector 51 is here a detector of the ADIXEN Company, marketed under the reference ASM380. The leak detection device 50 equipped with such a helium detector 51 has a helium leak rate detection threshold (or "minimum detectable helium leak rate") around $5 \cdot 10^{-12}$ mbar·l·s$^{-1}$.

The leak detection device 50 also includes gas injection means 52, 53 for introducing helium (helium 4) in the vacuum deposition chamber 30.

As a variant, the gas injection means may for example introduce other light gases such as helium 3 ($^3$He: isotope of helium 4) or hydrogen (H$_2$).

In the particular embodiment of the vacuum deposition apparatus 10 according to the invention illustrated in FIG. 1, the gas injection means 52, 53 of the leak detection device 50 also introduce an inert gas in the vacuum deposition chamber 30, the inert gas forming a gaseous mixture with helium.

As an alternative, the gas injection means may for example be mounted on another chamber in fluidic communication with the vacuum deposition chamber of the vacuum deposition apparatus.

The gaseous mixture introduced here by the gas injection means 52, 53 is a gaseous mixture consisted of helium and dinitrogen (N$_2$) with a molar fraction of 1000 ppm (ppm=part per million) of helium.

The gaseous mixture of helium and dinitrogen is stored in a bottle 52 containing the gaseous mixture at a pressure comprised between 1 bar and 250 bars and equipped with a low-pressure regulator (not shown).

The gaseous mixture coming out of the bottle 52 is then generally conducted to an injection valve 53 that, if open, allows the flowing of the pressurized gaseous mixture up to the vacuum deposition chamber 30.

So arranged, the gas injection means 52, 53 allow a gaseous mixture containing at least partially helium to be injected in the vacuum deposition chamber 30.

The vacuum deposition chamber 30 being here in communication with the inner tank 24 when the inner tank valve 28 is open, the gas injection means 52, 53 thus allow the introduction of the gaseous mixture into the inner tank 24.

Likewise, as in the particular embodiment of the invention shown in FIG. 1, the chamber volume 31 and the outer enclosure volume 23 communicate with each other, the gas injection means 52, 53 also allow the introduction of the gaseous mixture into the outer enclosure 21. The gaseous mixture then occupies all the available space, i.e. the outer enclosure volume 23 and the chamber volume 31, which communicate with each other in the case shown in FIG. 1.

Using such a gaseous mixture, with extremely reduced helium content, the leak detection tests may be performed in higher pressure conditions thus simulating the operation of the vacuum deposition apparatus 10 in normal conditions of use. Therefore, for a same operating pressure, the work is made with a reduced molar fraction of helium, and thus a reduced partial pressure of helium, which limits the problems of saturation of the helium detector 51 during a leak detection test. It is thus possible to perform detection tests as rapidly as with pure helium in "stop" conditions of the vacuum deposition apparatus 10.

The leak detection device 50 also includes pressure measuring means 54, 54A inside the vacuum deposition chamber 30. These measuring means comprise a combined vacuum gauge 54A placed inside the vacuum deposition chamber 30.

This combined vacuum gauge 54 generally includes:
- a secondary vacuum gauge of the "Bayard-Alpert ionic gauge" type for measuring chamber pressures comprised between $10^{-10}$ and $10^{-3}$ mbar;
- a primary vacuum gauge of the "convection Pirani gauge" type for measuring chamber pressures comprised between $10^{-4}$ and 1000 mbar.

Such pressure measuring means 54, 54A thus allow measuring chamber pressures comprised between $10^{-10}$ and 1000 mbar, and this with a response time of the order of about $10^{-3}$ second, or even up to about 1 second.

At the end of the injection of the gaseous mixture by the gas injection means 52, 53 in the vacuum deposition chamber 30, when the inner tank valve 28 is open, the secondary pump valve 43 is closed and the gaseous mixture also fills the inner tank 24, the pressure measuring means 54, 54A measure a chamber pressure that is the same as the pressure inside the inner tank 24, which is in static equilibrium with the vacuum deposition chamber 30.

The combined vacuum gauge 54A is generally piloted by a vacuum gauge controller 54 that delivers a signal representative of the pressure (in mbar) inside the vacuum deposition chamber 30.

As explained hereinabove, when the inner tank 24 is in communication with the vacuum deposition chamber 30 thanks to the opening of the inner tank valve 28, the gaseous mixture introduced in the vacuum deposition chamber 30 also fills the inner tank 24, such that the pressure inside the vacuum deposition chamber 30 is equal to the pressure inside the inner tank 24.

Therefore, the vacuum gauge controller 54 delivers a signal that is also representative of the pressure (in mbar) inside the inner tank 24.

The leak detection device 50 further includes signal processing means 55 processing the signal relating to the helium flow rate delivered by the helium detector 51 and the signal relating to the pressure in the inner tank 24 delivered by the pressure measuring means 54, 54A, to deliver a signal representative of the leak rate of the inner tank 24 and the inner tank valve 28.

In the particular embodiment shown in FIG. 1, the leak detection device 50 also includes display means 56 connected to the signal processing means 55, allowing an operator to visualize the result of the leak detection test carried out by the vacuum deposition apparatus 10 according to the invention.

Such display means 56 here comprise a digital screen.

The leak detection device 50 finally preferably includes piloting means 57 controlling, on the one hand, the gas injection means 52, 53 and, on the other hand, the opening and closing of the inner tank valve 28, the secondary pump valve 43, the primary pump valve 44 and the by-pass valve 45.

The piloting means 57 are linked, on one side, to the signal processing means 55 that provide them with information relating to the leak rates measured in the inner tank 24 and the inner tank valve 28, and on another side, to four actuators 57A, 57B, 57C and 57D piloting the injection valve 53, the secondary pump valve 43, the by-pass valve 45 and the primary pump valve 44, respectively.

Furthermore, the piloting means 57 are linked to the inner tank valve actuator 29A that pilots the inner tank valve 28.

As described hereinabove for the inner tank valve actuator 29A, each of the actuators 57A, 57B, 57C and 57D allows varying and knowing the opening percentage of each of the piloted valves 53, 43, 44, 45.

The piloting means 57 are in particular programmed to pilot the actuators 57A and 57D of the by-pass valve 45 and of the primary pump valve 44 in such a way that:
 the primary pump valve 44 is closed when the by-pass valve 45 is open, wherein the compressed gases coming out of the secondary pump output 42B are then conducted toward the input of the helium detector 51A, and that:
 the by-pass valve 45 is closed when the primary pump valve 44 is open, wherein the compressed gases coming out of the secondary pump output 42B are then conducted toward the primary pump input 41A.

Second Embodiment

Figure 2:
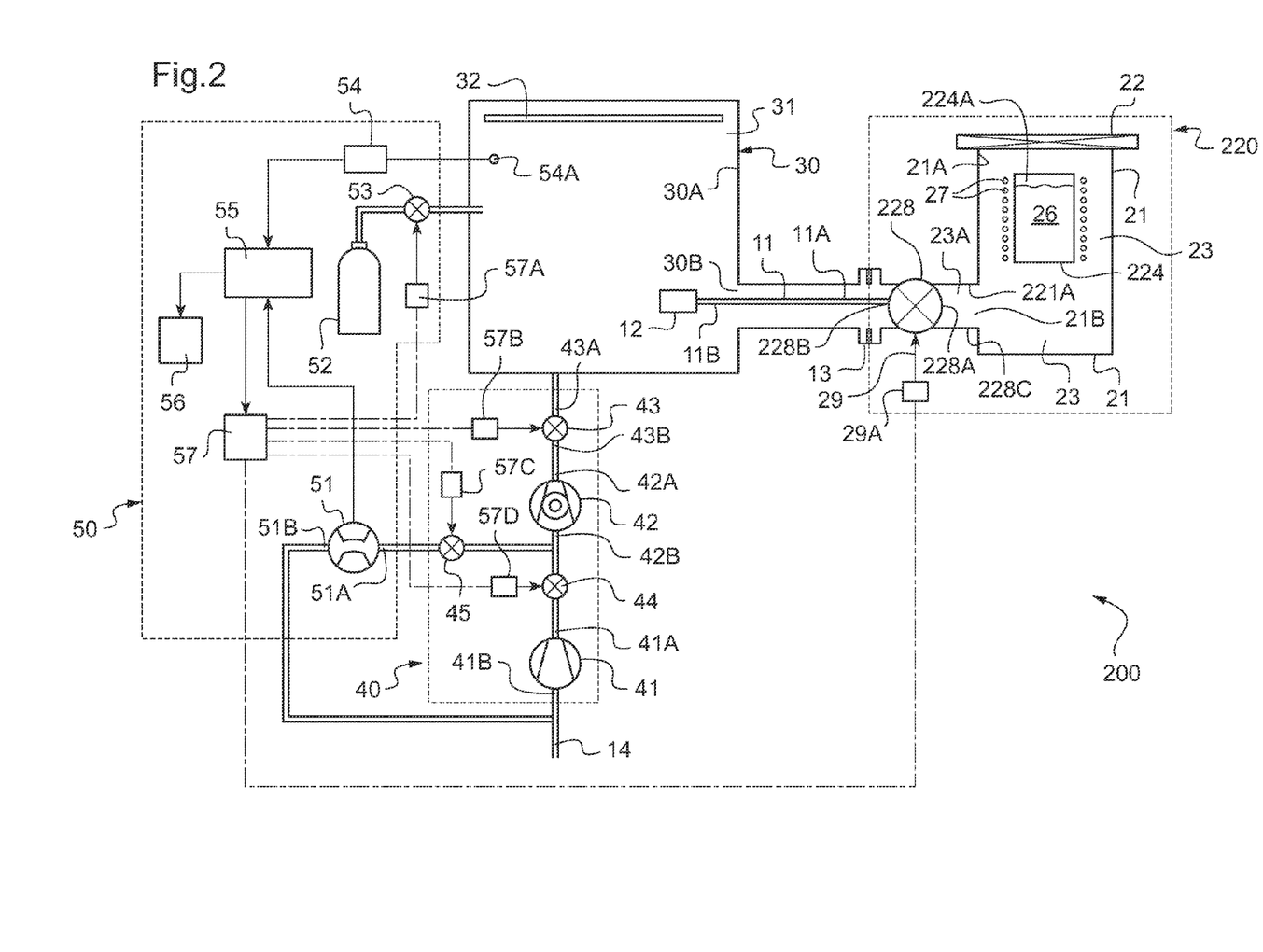
FIG. 2 is a schematic overall view of a vacuum deposition apparatus according to a second embodiment.

FIG. 2

FIG. 2 shows a schematic overall view of a vacuum deposition apparatus 200, according to a second embodiment, which comprises a valve cell 220 with an inner tank 224 open in the outer enclosure 21. The free volume 224A is thus in direct communication with the outer enclosure volume 23 of the outer enclosure 21. Therefore, the inner tank 224 comprises no filling flange.

As a variant, it may be provided additional means for heating the inner tank, located outside the outer enclosure.

As another variant, and advantageously, the means for heating the inner tank may be located outside the outer enclosure.

Figure 3:
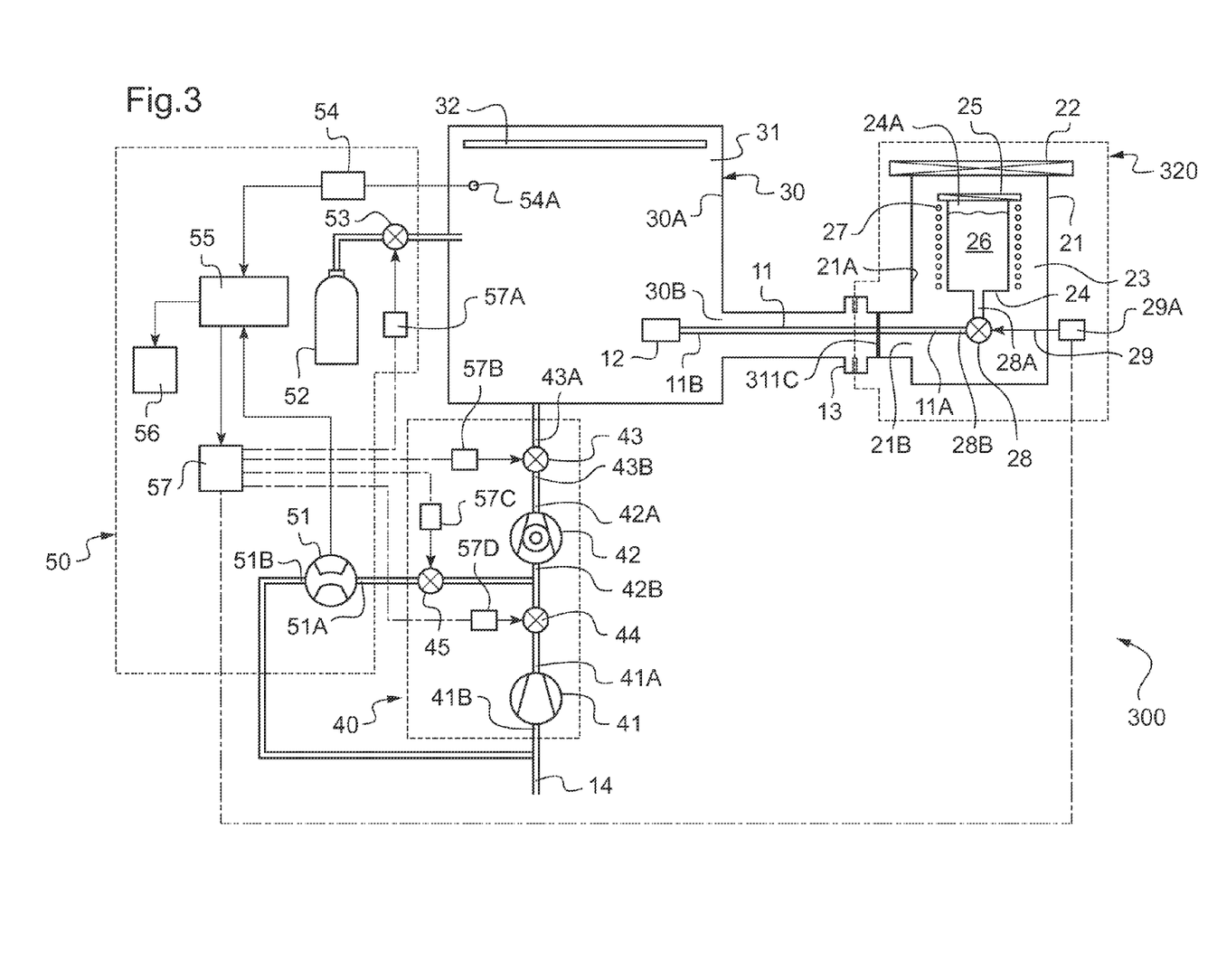
FIG. 3 is a schematic overall view of a vacuum deposition apparatus according to a third embodiment.

During the heating of the inner tank 224 by the heating means 27, the material to be evaporated 26 evaporates toward the upper part of the inner tank 224 to fill all the outer enclosure volume 23, in particular the particular volume 23A comprised between the first opening 21B of the outer enclosure 21 and the input port 228A of the inner tank valve 228 (see FIG. 3). The inner tank valve 228 is thus in fluidic communication with the inner tank 224.

As shown in FIG. 2, the outer enclosure 21 indeed comprises an enclosure tube 221A connecting the first opening 21B to the input port 228A of the inner tank valve 228.

Moreover, the inner tank valve 228 forms one of the ends of a valve tube 228C, the other end being connected to the outer enclosure 21 at the first opening 21B.

The inner tank valve 228 also comprises an output port 228B connected to the transfer tube 11 that goes through the second wall 30A of the vacuum deposition chamber 30 (see FIG. 2).

In this second embodiment, the inner tank valve 228 also makes it possible to isolate the outer enclosure 21 of the vacuum deposition chamber 30. Indeed, in closed position, the inner tank valve 228 inhibits not only the flowing of the material to be evaporated from the particular volume 23A toward the chamber volume 31 of the vacuum deposition chamber 30, but also the placement of the outer enclosure 21 in fluidic communication with the vacuum deposition chamber 30.

Third Embodiment

FIG. 3

Unlike in the first embodiment of the vacuum deposition apparatus 10 shown in FIG. 1, a weld may exist, for example at the connecting flange, between the outer enclosure and the transfer tube. In this case, the vacuum deposition chamber does not communicate with the outer enclosure and the chamber and outer enclosure volumes are distinct from each other.

Hence, it has been shown in FIG. 3 a schematic overall view of a vacuum deposition apparatus 300, according to a third embodiment, in which the outer enclosure 21 is also isolated from the vacuum deposition chamber 30.

Indeed, as shown in FIG. 3, the valve cell 320 is different from the valve cell 20 of the first embodiment (see FIG. 1) in that it comprises means for isolating the outer enclosure 21.

More particularly, in this third embodiment, it is provided a tight weld 311C between the outer enclosure 21 and the transfer tube 11.

Thus, in this particular configuration, the outer enclosure 21 is no longer in fluidic communication with the vacuum deposition chamber 30, the outer enclosure volume 23 being isolated from the chamber volume 31 thanks to the weld 311C.

In this third embodiment, the outer enclosure 21 is irrevocably isolated from the vacuum deposition chamber 30 thanks to the weld 311C.

This configuration is different from that of the second embodiment of the vacuum deposition apparatus 200 shown in FIG. 2, in which it is all the same possible to place the vacuum deposition chamber 30 in communication with the outer enclosure 21 through the opening of the inner tank valve 228.

Leak detection method in the various embodiments of the vacuum deposition apparatus 10; 200; 300

A method according to the invention will now be described, which can be applied by the operator to detect a leak of the inner tank 24; 224 and/or the inner tank valve 28; 228.

This detection method may advantageously be implemented for each of the above-described embodiments of the vacuum deposition apparatus 10; 200; 300 (see FIGS. 1 to 3).

However, it is understood that:
- in the first embodiment (see FIG. 1), the leak detection method according to the invention wholly tests the tightness of the inner tank valve 28 and of the inner tank 24 (i.e. of its filling flange 25) without being capable of distinguishing the origin of a potential leak;
- in the second embodiment (see FIG. 2), wherein the inner tank 224 cannot have any leak, the leak detection method according to the invention tests only the tightness of the inner tank valve 228, and
- in the third embodiment (see FIG. 3), wherein the outer enclosure 21 is isolated from the vacuum deposition chamber 30 thanks to the weld 311C, the leak detection method according to the invention tests also only the tightness of the inner tank valve 28.

1) Initialization step

The operator first carries out a step of initialization of the vacuum deposition apparatus 10; 200; 300, aiming to measure the leak rate of the residual helium in the vacuum deposition chamber 30. For that purpose, he performs the following operations:

1a) Preparing the valve cell 20; 220; 320 to be tested and the leak detection device 50
  closing the inner tank valve 28; 228 and placing the filling flange 25 (if present) on the inner tank 24; 224;
  verifying the tightness of the cell flange 22 and of the vacuum deposition chamber 30;
  closing the secondary pump valve 43;
  opening the primary pump valve 44 and closing of the by-pass valve 45;
  connecting the helium detector 51 to the by-pass valve 45 and powering-up the detector;
  preparing the injection means 52, 53 for injection of the gaseous mixture He/N$_2$ and draining the injection line.

1b) Evacuating the vacuum deposition apparatus 10; 200; 300
  opening the inner tank valve 28; 228;
  opening the secondary pump valve 43;
  powering-up the primary pump 41 and the secondary pump 42;
  waiting until the pressure in the vacuum deposition chamber 30 is lower than $10^{-5}$ mbar, preferably lower than $10^{-6}$ mbar.

1c) Verifying the base signal of the helium detector 51
  closing the primary pump valve 44 and opening the by-pass valve 45;
  measuring the leak rate of the residual helium in the vacuum deposition chamber 30 and waiting for the stabilization of the leak rate of the inner tank 24; 224 and of the inner tank valve 28; 228 to a value lower than $10^{-10}$ mbar·l·s$^{-1}$;
  logging the previous stabilized initial value;
  opening the primary pump valve 44 and closing the by-pass valve 45.

2) Measurement step

After the initialization step, the operator may proceed to a measurement step aiming to measure the leak rate of the inner tank 24; 224 and/or the inner tank valve 28; 228. For that purpose, he performs the following operations:

2a) Pressurization of the vacuum deposition apparatus 10; 200; 300
  verifying that all the temperatures are lower than 800° C.;
  closing the secondary pump valve 43 and opening the inner tank valve 28; 228 to place the vacuum deposition chamber 30 in fluidic communication with the inner tank 24; 224;
  injecting thanks to the injection mean 52, 53 a helium/nitrogen gaseous mixture at 1000 ppm of molar fraction in helium and filling the vacuum deposition chamber 30 up to chamber pressure set-point comprised between $10^{-4}$ et $10^{-1}$ mbar;
  logging the static pressure P0 inside the inner tank 24; 224 reached after a wait of 1 minute;

2b) Pumping of the vacuum deposition apparatus 10; 200; 300
  closing the inner tank valve 28; 228;
  opening the secondary pump valve 43;
  evacuating the vacuum deposition chamber 30 until the chamber pressure is lower than $10^{-6}$ mbar;

2c) Measuring the leak rate of the inner tank 24; 224 and/or the inner tank valve 28; 228
  closing the primary pump valve 44 and opening the by-pass valve 45;
  measuring the helium leak flow rate by means of the helium detector 51 and calculating, by means of the leak detection device 50, the leak rate (in mbar·l·s$^{-1}$) of the inner tank 24; 224 and/or the inner tank valve 28; 228;
  logging the final value reached after stabilization.

At the end of these various operations, the operator gains a measure of the leak rate of the inner tank 24; 224 and/or the inner tank valve 28; 228 by comparing the stabilized values of the helium leak rate obtained at the initialization step and at the measuring step.

In the case where, before the leak detection method, the operator has measured, by a conventional method during the assembling of the vacuum deposition apparatus 10; 200; 300, the leak flow rate of the inner tank valve 28; 228, he can deduce the leak rate of the filling flange 25 based on the measure of the "overall" leak rate of the inner tank 24; 224 and the inner tank valve 28; 228, obtained by the above-mentioned method.

Therefore, the operator may determine the closing torque required for the inner tank valve 28; 228 to obtain a given tightness level, providing that the filling flange 25 is tight enough. This makes it possible to notify to the user of such a vacuum deposition apparatus 10; 200; 300 an efficient closing torque value for the inner tank valve 28; 228 that is not excessive. Indeed, the inner tank valve, which is generally a metal valve, is more rapidly damaged when closed too tight.

The leak rate measurement is rapid according to the method applied by the operator. Indeed, upon the closing of the primary pump valve 44 and the concomitant opening of the by-pass valve 45, a tiny part of the gaseous mixture containing only a fraction of pure helium reaches the helium detector 51, which is therefore not saturated by the helium quantity. The measurement of the leak rate may then be performed very rapidly, typically within 1 second. Moreover, by repeating the procedure hereinafter, the helium detector 51 and thus the leak detection device 50 may be rapidly operative again, for example to detect a leak at the level of another inner tank containing another material to be evaporated or to measure the leak rate of the inner tank valve 28; 228 in other opening or closing positions.

The invention claimed is:
1. A valve-cell vacuum deposition apparatus (10; 200; 300) including:
   at least one valve cell (20; 220; 320) comprising:
      an outer enclosure (21),
      an inner tank (24; 224), located inside the outer enclosure (21) and adapted to contain a material to be evaporated (26),
      an inner tank valve (28; 228) comprising a valve input port (28A; 228A) in fluidic communication with the inner tank (24; 224) and a valve output port (28B; 228B),
   a vacuum deposition chamber (30),
   a transfer tube (11) comprising a tube input port (11A) and connected to the valve output port (28B; 228B) of the inner tank valve (28; 228) and a tube output port (11B), in such a manner that the tube output port (11B) is located inside the vacuum deposition chamber (30), the tube output port (11B) including an injector (12) adapted to generate a jet of vapour of the material to be evaporated (26) inside the vacuum deposition chamber (30), the vacuum deposition chamber (30) being connected to the outer enclosure (21) by means of a connecting flange (13), and
   pumping means (40) adapted to evacuate the inside of the vacuum deposition chamber (30), the pumping means comprising:
      a primary pump (41) having a primary pump input (41A) and a primary pump output (41B), and
      a secondary pump (42) having a secondary pump input (42A) and a secondary pump output (42B), the secondary pump output (42B) being connected to the primary pump input (41A),
characterized in that it includes a leak detection device (50) comprising:
   gas injection means (52, 53) adapted to introduce helium in the vacuum deposition chamber (30),
   gas pumping means adapted to pump the helium present in the vacuum deposition chamber (30),
   a helium detector (51) comprising a detector input (51A), the helium detector (51) delivering a signal representative of the helium flow rate through it,
   pressure measuring means (54, 54A) adapted to measure the pressure inside the vacuum deposition chamber (30), and
   signal processing means (55) adapted to process the signal relating to the helium flow rate delivered by the helium detector (51) and the signal delivered by the pressure measuring means (54, 54A), to deliver a signal representative of the leak rate of the inner tank valve (28; 228), and in that the pumping means (40) also include:
   a secondary pump valve (43) placed between the vacuum deposition chamber (30) and the secondary pump input (42A),
   a primary pump valve (44) placed between the secondary pump output (42B) and the primary pump input (41A), and
   a by-pass valve (45) placed between the secondary pump output (42B) and the detector input (51A), the by-pass being made upstream the primary pump valve (44).

2. The vacuum deposition apparatus (10; 300) according to claim 1, wherein the inner tank valve (28) is located inside the outer enclosure (21), with its valve input port (28A) connected to the inner tank (24).

3. The vacuum deposition apparatus (10; 300) according to claim 1, wherein the tube input port (11A) of the transfer tube (11) is located inside the outer enclosure (21), with the transfer tube (11) going through a first wall (21A) of the outer enclosure (21) and a second wall (30A) of the vacuum deposition chamber (30).

4. The vacuum deposition apparatus (10) according to claim 1, wherein the pressure measuring means (54, 54A) deliver a signal representative of the pressure inside the inner tank (24).

5. The vacuum deposition apparatus (10) according to claim 1, wherein the outer enclosure (21) is in fluidic communication with the vacuum deposition chamber (30).

6. The vacuum deposition apparatus (10; 200; 300) according to claim 1, wherein the secondary pump (42) is a turbomolecular pump.

7. The vacuum deposition apparatus (10; 200; 300) according to claim 1, wherein the secondary pump valve (43) is a slide gate valve.

8. The vacuum deposition apparatus according to claim 1, wherein the secondary pump valve is a butterfly valve or a pendulous valve.

9. The vacuum deposition apparatus (10; 200; 300) according to claim 1, wherein the gas injection means (52, 53) of the leak detection device (50) are also adapted to introduce an inert gas in the vacuum deposition chamber (30), the inert gas forming a gaseous mixture with helium.

10. The vacuum deposition apparatus (10; 200; 300) according to claim 1, wherein the leak detection device (50) also comprises piloting means (57) adapted to control the gas injection means (52, 53) and the opening and closing of the inner tank valve (28; 228), the secondary pump valve (43), the primary pump valve (44) and the by-pass valve (45).

11. The vacuum deposition apparatus (10) according to claim 1, wherein the signal processing means (55) deliver a signal representative of the leak rate of the inner tank valve (28) and the inner tank (24).

12. The vacuum deposition apparatus (10; 300) according to claim 11, wherein the inner tank valve (28) is located inside the outer enclosure (21), with its valve input port (28A) connected to the inner tank (24).

13. The vacuum deposition apparatus (10; 300) according to claim 11, wherein the tube input port (11A) of the transfer tube (11) is located inside the outer enclosure (21), with the transfer tube (11) going through a first wall (21A) of the outer enclosure (21) and a second wall (30A) of the vacuum deposition chamber (30).

14. The vacuum deposition apparatus (200; 300) according to claim 1, wherein there are provided isolation means (228; 311C) adapted to isolate the outer enclosure (21) from the vacuum deposition chamber (30).

15. The vacuum deposition apparatus (200) according to claim 14, wherein the isolation means comprise the inner tank valve (228).

16. The vacuum deposition apparatus (300) according to claim 14, wherein the isolation means comprise a weld (311C) between the outer enclosure (21) and the transfer tube (11).

17. A method for detecting a leak in a valve-cell vacuum deposition apparatus (10) by deducing a leak rate, the vacuum deposition apparatus (10) including:

at least one valve cell (20) comprising:
- an outer enclosure (21),
- an inner tank (24; 224), located inside the outer enclosure (21), wherein the inner tank (24; 224) contains a material to be evaporated (26),
- an inner tank valve (28; 228) comprising a valve input port (28A; 228A) in fluidic communication with the inner tank (24; 224) and a valve output port (28B; 228B),
- a vacuum deposition chamber (30), and
- a leak detection device (50), the leak detection method being characterized in that it includes:
- an initialization step wherein:
  - the inside of the vacuum deposition chamber (30) is evacuated, and
  - an initial leak flow rate in the vacuum deposition chamber (30) is measured by means of the leak detection device (50), and
- a measurement step wherein:
  - the inner tank valve (28; 228) is opened to place the vacuum deposition chamber (30) in fluidic communication with the inner tank (24; 224), and
  - a gaseous mixture is injected in the vacuum deposition chamber (30), and
  - a pressure P0 inside the inner tank (24; 224) is measured, and
  - the inner tank valve (28; 228) is closed, and
  - the inside of the vacuum deposition chamber (30) is evacuated down to a predetermined pressure in the vacuum deposition chamber (30), and
  - the vacuum deposition chamber (30) is placed in communication with the leak detection device (50), and
  - a final leak flow rate in the vacuum deposition chamber (30) is measured by means of the leak detection device (50), and
- a leak rate of the inner tank valve (28; 228) is deduced from the final leak flow rate and the initial leak flow rate.

18. The leak detection method according to claim 17, wherein the inner tank valve (28) of the vacuum deposition apparatus (10; 300) is located inside the outer enclosure (21), with its valve input port (28A) connected to the inner tank (24).

19. The leak detection method according to claim 17, wherein, at the end of the measurement step, the leak rate of the inner tank valve (28; 228) and the inner tank (24; 224) is deduced.

20. The leak detection method according to claim 19, wherein the inner tank valve (28) of the vacuum deposition apparatus (10; 300) is located inside the outer enclosure (21), with its valve input port (28A) connected to the inner tank (24).

* * * * *